(12) United States Patent
Ikemura et al.

(10) Patent No.: US 11,674,733 B2
(45) Date of Patent: Jun. 13, 2023

(54) COLD INSULATION CONTAINER

(71) Applicants: E-ThermoGentek Co., Ltd., Kyoto (JP); All NIPPON AIRWAYS TRADING CO., LTD., Tokyo (JP)

(72) Inventors: Akihiko Ikemura, Kyoto (JP); Michio Okajima, Kyoto (JP); Keiichi Ohata, Kyoto (JP); Shutaro Nambu, Kyoto (JP); Ken Nishimura, Tokyo (JP)

(73) Assignees: E-ThermoGentek Co., Ltd., Kyoto (JP); All NIPPON AIRWAYS TRADING CO., LTD., Tokyo (JP)

(*) Notice: Subject to any disclaimer, the term of this patent is extended or adjusted under 35 U.S.C. 154(b) by 452 days.

(21) Appl. No.: 16/715,832

(22) Filed: Dec. 16, 2019

(65) Prior Publication Data

US 2020/0263915 A1    Aug. 20, 2020

(30) Foreign Application Priority Data

Feb. 20, 2019 (JP) .............................. JP2019-028506

(51) Int. Cl.
    *F25D 17/04* (2006.01)
    *F25B 21/02* (2006.01)

(52) U.S. Cl.
    CPC ............ *F25D 17/045* (2013.01); *F25B 21/02* (2013.01); *F25B 2321/0211* (2013.01); *F25B 2321/0251* (2013.01); *F25D 2317/0681* (2013.01)

(58) Field of Classification Search
    CPC ........... F25D 17/045; F25D 2317/0681; F25D 2700/12; F25D 17/06; F25D 3/125; F25D 16/00; F25D 3/122; F25D 11/003; F25B 21/02; F25B 2321/0211; F25B 2321/0251; F25B 27/00; F25B 2321/02; F25B 2321/021; F25B 2321/0212; H01L 35/00; H01L 23/38
    See application file for complete search history.

(56) References Cited

U.S. PATENT DOCUMENTS

| 4,981,019 | A | * | 1/1991 | Hicks | .................... | F25B 27/007 |
|           |   |   |        |       |                       | 62/3.62     |
| 5,784,895 | A | * | 7/1998 | Choi  | ..................... | A47F 3/0447 |
|           |   |   |        |       |                       | 62/256      |

(Continued)

FOREIGN PATENT DOCUMENTS

| JP | H02-290485 A | 11/1990 |
| JP | H5-215455 A  | 8/1993  |

(Continued)

*Primary Examiner* — Ana M Vazquez
(74) *Attorney, Agent, or Firm* — Renner, Otto, Boisselle & Sklar, LLP

(57) ABSTRACT

A cold insulation container includes: a cold insulation storage including a coolant vessel; a circulating air fan that causes cold air from the coolant vessel to circulate in the cold insulation storage; a thermoelectric generating module attached to an outer surface of the coolant vessel; and a temperature controller that adjusts a temperature in the cold insulation storage. A temperature difference between the coolant vessel and circulating cold air in the cold insulation storage causes the temperature controller and the circulating air fan to be driven by thermoelectric power generated by the thermoelectric generating module.

5 Claims, 4 Drawing Sheets

(56) References Cited

U.S. PATENT DOCUMENTS

2014/0016665 A1* 1/2014 Stachow ................ G01K 17/08
                                                        374/45
2017/0056289 A1* 3/2017 Tsuno ..................... F25B 21/04
2018/0266895 A1* 9/2018 Perez ................. B64D 11/0007

FOREIGN PATENT DOCUMENTS

| JP | H10-132339 A | | 5/1998 | |
|---|---|---|---|---|
| JP | 2000028252 A | * | 1/2000 | |
| JP | 2000-081263 A | | 3/2000 | |
| JP | 2001-241816 A | | 9/2001 | |
| JP | 2003-156272 A | | 5/2003 | |
| JP | 2006-145168 A | | 6/2006 | |
| WO | WO-2015055836 A1 | * | 4/2015 | .............. A61J 1/165 |

* cited by examiner

COLD INSULATION CONTAINER

CROSS-REFERENCE TO RELATED APPLICATION

This application claims priority to Japanese Patent Application No. 2019-028506 filed on Feb. 20, 2019, the disclosure of which including the specification, the drawings, and the claims is hereby incorporated by reference in its entirety.

BACKGROUND

The present disclosure relates to a cold insulation container mounted on, for example, an aircraft and used for transporting chilled and frozen products, such as fresh food and frozen food, at low temperature.

In an increased number of recent cases, chilled and frozen products, such as fresh food and frozen food, are transported over long distances. Such food is stored in a cold insulation container in which food or the like can be maintained at constant temperatures in order to maintain quality during transportation.

Japanese Patent Publication No. H02-290485 describes a cold insulation container whose temperature is controllable. As illustrated in FIG. 6, a cold insulation container 101 described in Japanese Patent Publication No. H02-290485 includes a cold insulation box 107 and a door 103 for taking a product at the front thereof. A cold storage device 109 is attached to the inner side of a rear wall of the cold insulation box 107. A cold storage panel 111 of the cold storage device 109 is provided with a control unit 113 for controlling freezing of a cold storage agent 125.

A ceiling of the cold insulation box 107 is provided with a circulating fan 115 for agitating air in the cold insulation box 107 to uniformize the temperature. Reference numeral 123 represents an evaporation pipe constituting a refrigeration cycle, reference numeral 131 represents a cooling passage, reference numeral 135 represents an air inlet in the cold insulation box 107, and reference numeral 153 represents a cooling fan.

In the case of transportation by a vehicle or an aircraft, the cold insulation container 101 is used in such a manner that the cold storage device 109 is first operated with a commercial power supply to freeze the cold storage agent 125, and then, products are housed in the cold insulation box 107, and the container 101 is mounted on the vehicle or the aircraft. Thereafter, the control unit 113 is operated with the commercial power supply to drive the cooling fan 153 and the circulating fan 115 such that the temperature in the cold insulation box 107 is made uniform and constant.

Japanese Patent Publication No. 2001-241816 describes a simple configuration of a cold insulation container in which a cold insulator room for storing a cold insulator such as dry ice is disposed adjacent to a product storage room, and an ventilation duct is disposed between the cold insulator storage room and the product storage room so that cold air subjected to heat exchange with the cold insulator storage room is blown by an air blower into the product storage room through the ventilation duct. In this configuration, the air blower is driven by a battery power supply, and is controlled to operate or stop by a thermostat such that the inside of the product storage room is kept at a predetermined temperature.

SUMMARY

The cold insulation container described in Japanese Patent Publication No. H02-290485, however, needs the cold storage device, which has disadvantages in which the time for freezing the cold storage agent is required before use, and after being mounted on a vehicle or an aircraft, power of the commercial power supply is consumed, disadvantageously.

The cold insulation container described in Japanese Patent Publication No. 2001-241816 also has the disadvantages of increased power consumption of the battery power supply and increased costs for replacing battery power supplies.

The present disclosure has been made in view of the foregoing circumstances and has a main object of providing a cold insulation container that is capable of keeping the inside of a cold insulation storage at a constant temperature by circulating air, performs effective cooling, and drives a temperature controller and a circulating air fan by self-generated electric power.

A cold insulation container according to the present disclosure includes: a cold insulation storage including a coolant vessel; a circulating air fan that causes cold air from the coolant vessel to circulate in the cold insulation storage; a thermoelectric generating module attached to an outer surface of the coolant vessel; and a temperature controller that adjusts a temperature in the cold insulation storage. A temperature difference between the coolant vessel and circulating cold air in the cold insulation storage causes the temperature controller and the circulating air fan to be driven by thermoelectric power generated by the thermoelectric generating module.

The present disclosure can provide a cold insulation container having the function of making the temperature in a cold insulation storage uniform and constant by self-generated electric power, with an easy and simple configuration.

DETAILED DESCRIPTION

Embodiments of the present disclosure will be described in detail with reference to the drawings. Note that the present disclosure is not limited to the following embodiments. The embodiments may be appropriately modified within a range not deviating from the range showing advantages of the present disclosure.

Figure 1:
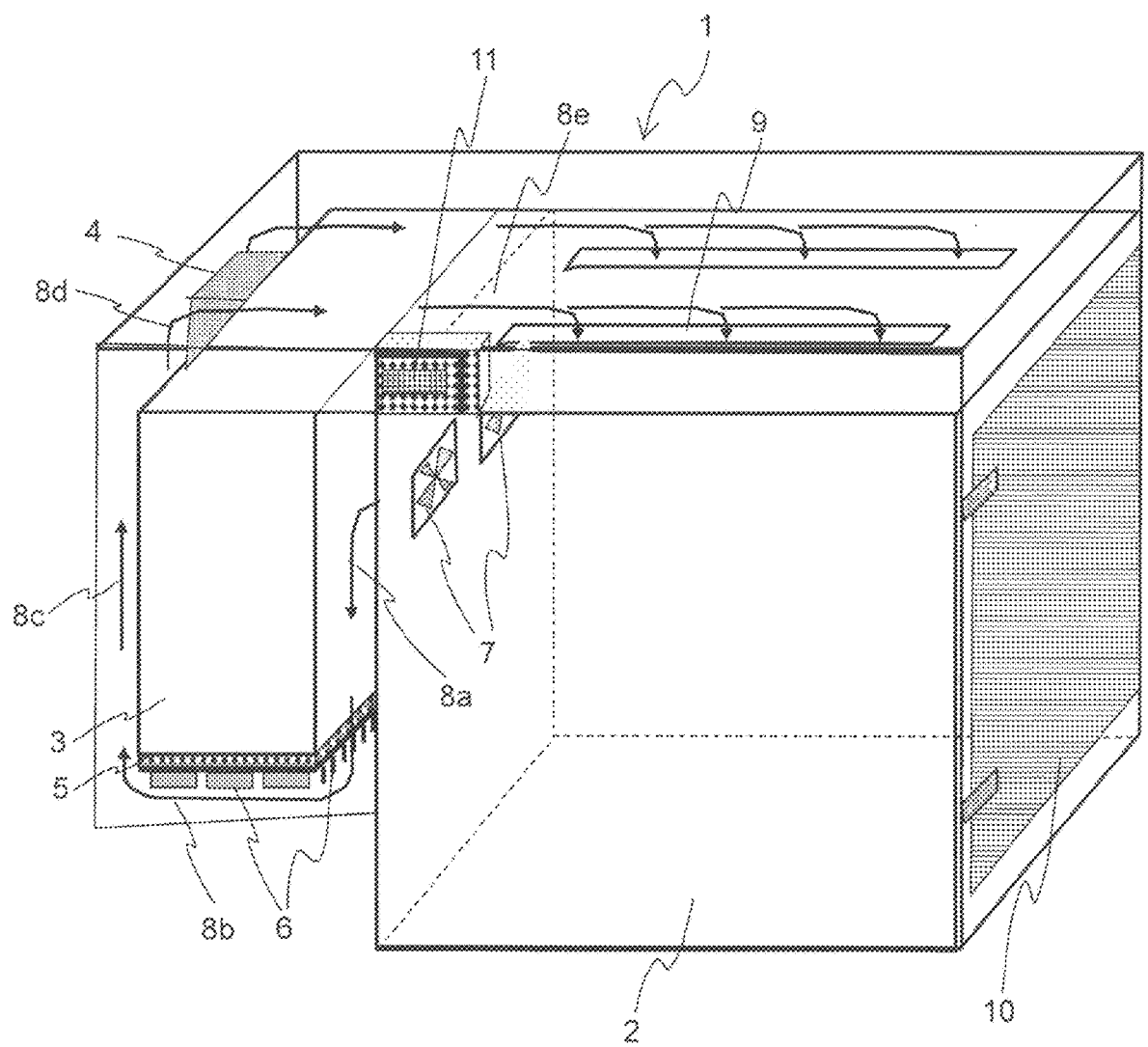
FIG. 1 illustrates a configuration of a cold insulation container according to one embodiment of the present disclosure.
Figure 2:
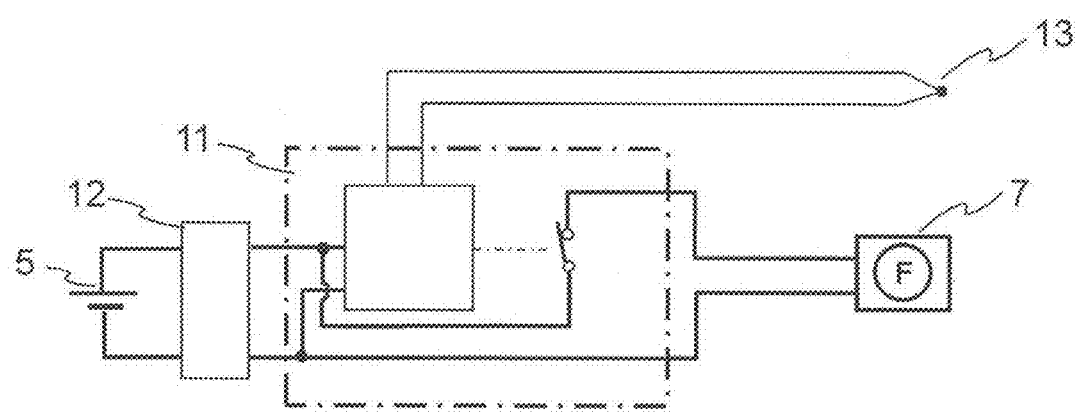
FIG. 2 is an electric circuit diagram of the cold insulation container according to one embodiment of the present disclosure in a low- and constant-temperature operation.

FIG. 1 illustrates a configuration of a cold insulation container according to one embodiment of the present disclosure. FIG. 2 is an electric circuit diagram illustrating a low- and constant-temperature operation in a cold insulation storage of the cold insulation container.

As illustrated in FIG. 1, a cold insulation container 1 according to this embodiment includes, as main components, a cold insulation storage 2, a coolant vessel 3, a thermoelectric generating module 5 attached to an outer surface of the coolant vessel 3, radiational cooling fins 6, circulating air fans 7 for circulating cold air in the cold insulation storage 2, and a temperature controller 11. In FIG. 1, reference numeral 4 represents a door at a coolant inlet, and reference numeral 10 represents a door of the cold insulation storage 2. In FIG. 2, reference numeral 12 represents a DC-DC converter, and reference numeral 13 represents a temperature sensor.

The cold insulation container 1 in this embodiment operates in the following manner. When a coolant (e.g., dry ice) is placed in the coolant vessel 3 made of, for example, stainless, a portion of the thermoelectric generating module 5 attached to a coolant vessel is cooled, and a temperature difference between this portion and radiational cooling fins in contact with surrounding outdoor air causes the thermoelectric generating module 5 to start generating electric power immediately.

When it is determined, with a temperature sensor 13 disposed in the cold insulation storage 2, that the temperature in the cold insulation storage 2 is higher than a set temperature, a switch of a power supply line for the circulating air fans 7 is turned on so that the circulating air fans 7 are driven. Accordingly, air cooled by the radiational cooling fins 6 is circulated in directions indicated by arrows 8a through 8e to a cold air outlet 9 into the cold insulation storage 2 so that the inside of the cold insulation storage 2 is cooled.

When the temperature in the cold insulation storage 2 reaches the set temperature, the switch is turned off so that the circulating air fans 7 stop. This operation is repeated so that the temperature in the cold insulation storage 2 is kept substantially constant.

In this embodiment, electric power for driving the temperature controller 11 and the circulating air fans 7 is supplied from the thermoelectric generating module 5. Details (e.g., size and number) of the thermoelectric generating modules 5 attached to the coolant vessel may be determined appropriately in accordance with the level of electric power for driving. With respect to details of the DC-DC converter 12, the output voltage of the thermoelectric generating module 5 may be determined appropriately in accordance with input details (e.g., 12 V) of the temperature controller 11 and the circulating air fans 7.

The coolant is preferably dry ice. Dry ice is easily available and has a sublimation temperature of −79° C., and thus, is excellent as a coolant and capable of maintaining the temperatures of the coolant vessel 3, and the attachment surface of the thermoelectric generating module 5 and the radiational cooling fins 6 for a long period.

The thermoelectric generating module 5 is preferably attached to the bottom surface of the coolant vessel 3. Even when dry ice is consumed, the bottom surface of the coolant vessel 3 can be maintained at low temperature for a long period, and thus, electric power generation by the thermoelectric generating module 5 can be maintained for a long period.

As specific operation environments of the cold insulation container 1, the set temperature in the cold insulation storage 2 is −22° C., the temperature at which driving of the circulating air fans 7 starts is −21° C. or more, and electric power necessary for the temperature controller 11 and the circulating air fans 7 is 6 W, for example.

It is preferable that the thermoelectric generating module 5 preferably uses a BiTe-based device whose characteristics do not degrade at such low temperatures, and the thermoelectric generating module 5 having a device-occupied area of about 300 cm$^2$ is attached to the bottom surface of the coolant vessel 3. The radiational cooling fins 6 are preferably radiational cooling fins made of Al and having a surface area about 10 times as large as the device-occupied area.

Another Embodiment 1

Figure 3:
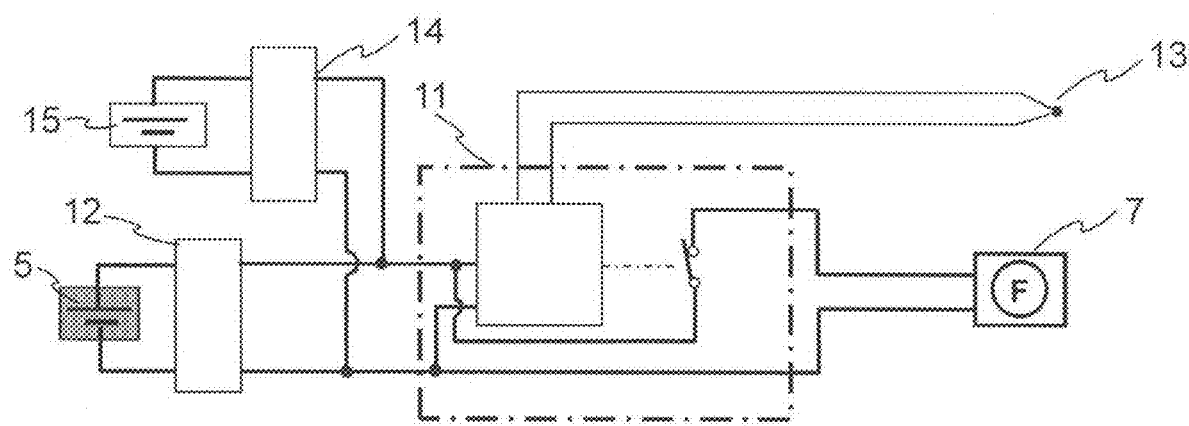
FIG. 3 is an electric circuit diagram of a cold insulation container according to another embodiment of the present disclosure.

FIG. 3 is an electric circuit diagram according to another embodiment 1 of the present disclosure. In this embodiment, a thermoelectric generating module 5 having a device-occupied area of 500 cm$^2$, and a secondary battery 15 is charged with surplus electric power.

Reference numeral 14 represents a control circuit for, for example, voltage control and overcharge prevention. The secondary battery may be a nickel-metal hydride battery, for example.

Another Embodiment 2

Figure 4:
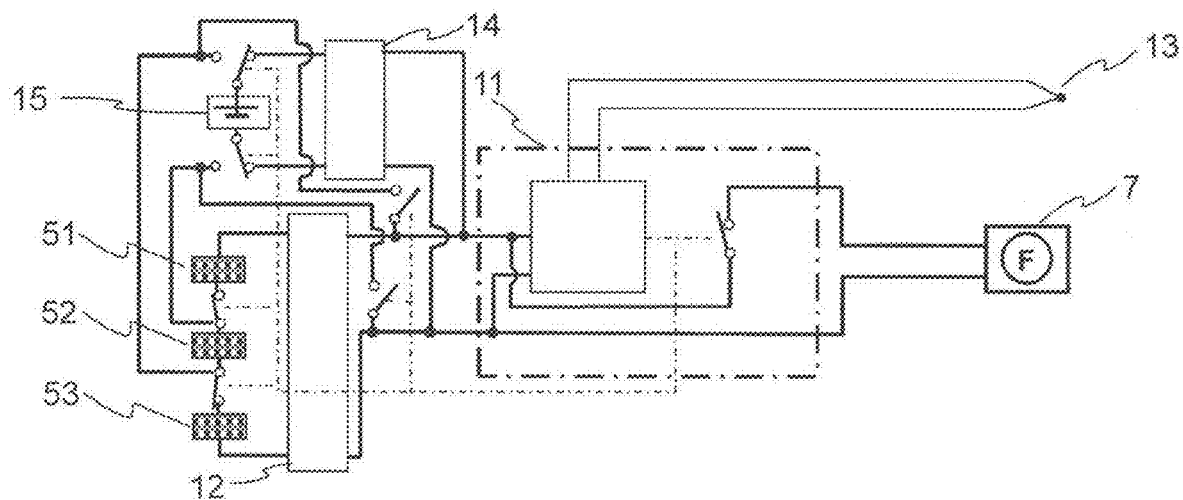
FIG. 4 is an electric circuit diagram during power generation in the other embodiment of the present disclosure.
Figure 5:
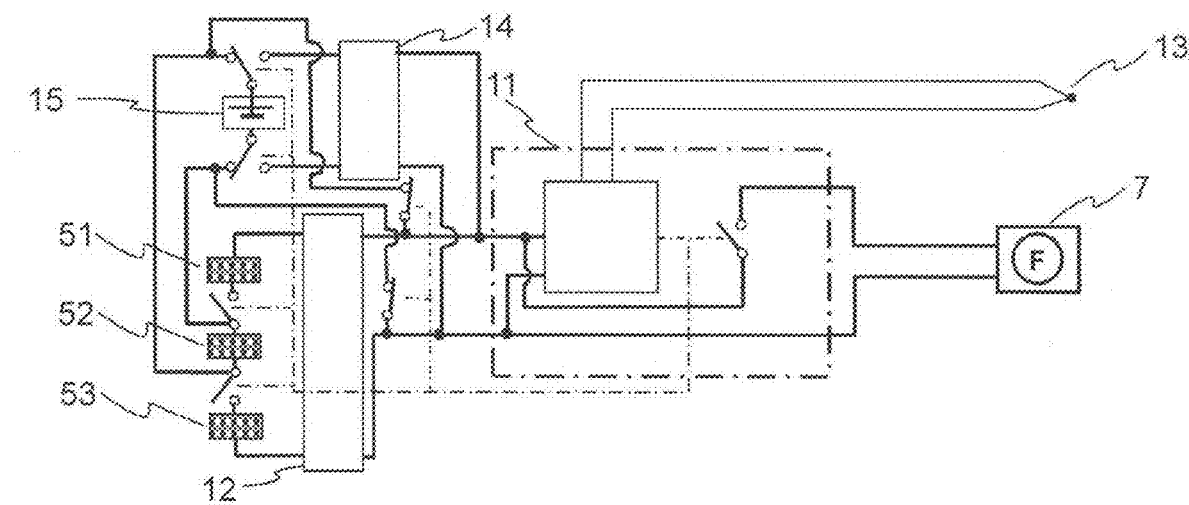
FIG. 5 is an electric circuit diagram in a Peltier mode in another embodiment of the present disclosure.
Figure 6:
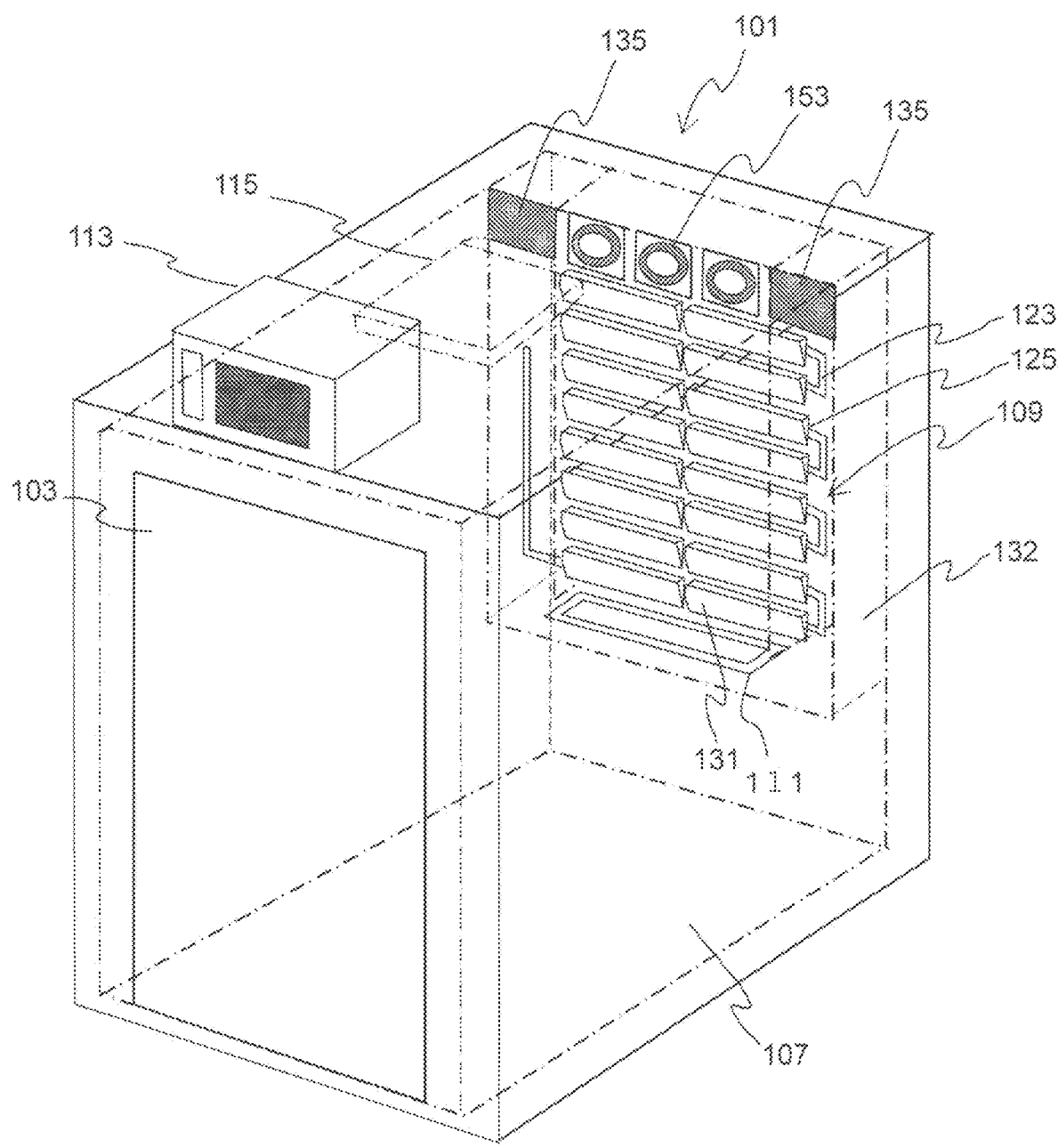
FIG. 6 illustrates a configuration of a typical cold insulation container.

FIGS. 4 and 5 are electric circuit diagrams according to another embodiment 2 of the present disclosure.

In a manner similar to FIG. 3, FIG. 4 illustrates a mode in which a thermoelectric generating module 5 generates electric power, a temperature controller 11 and a circulating air fans 7 are driven, and a secondary battery 15 is charged with surplus electric power.

FIG. 5 illustrates a mode in which the thermoelectric generating module 5 is set in a Peltier mode by electric power from the secondary battery 15 while the circulating air fans 7 are stopped so that a portion of the thermoelectric generating module 5 toward a coolant vessel 3 is cooled.

Effective cooling in the Peltier mode requires a large current. Thus, in this embodiment, the thermoelectric generating module 5 is divided into, for example, three modules 51, 52, and 53, and a current is caused to flow only in the center module 52.

Switches of circuits allowing such an operation cooperate with a switch for driving the circulating air fans 7, as indicated by connected chain lines. For example, the voltage of the secondary battery 15 can be 12 V, the module 52 in which a current flows in the Peltier mode is ⅓ of the whole module, a current is 2.5 A, and the heat absorption quantity is about 20 W.

Although the present disclosure has been described in the preferred embodiments, such description is not restrictive, and of course, various modifications may be made. In the foregoing embodiments, dry ice is used as a coolant as an example, but a cold storage agent using sodium polyacrylic acid or a refrigerant of ethylene glycol monobutyl ether may be used, for example.

What is claimed is:
1. A cold insulation container comprising:
a cold insulation storage including a coolant vessel;
a circulating air fan that causes cold air from the coolant vessel to circulate in the cold insulation storage;
a thermoelectric generating module attached to a bottom surface of the coolant vessel; and
a temperature controller that adjusts a temperature in the cold insulation storage, wherein
the thermoelectric generating module generates electric power from a temperature difference between the bottom surface of the coolant vessel and circulating cold air around the coolant vessel circulating in the cold insulation storage and having a temperature controlled by the temperature controller, and the temperature controller and the circulating air fan are driven by thermoelectric power generated by the thermoelectric generating module, and a radiational cooling fin is attached to a surface of the thermoelectric generating module toward circulating cold air and the circulating cold air around the coolant vessel is cooled by the radiational cooling fin.

2. The cold insulation container according to claim 1, wherein the coolant vessel houses dry ice.

3. The cold insulation container according to claim 1, further comprising a secondary battery that is charged with surplus thermoelectric power of the thermoelectric generating module.

4. The cold insulation container according to claim 3, wherein the coolant vessel is cooled by setting the thermoelectric generating module in a Peltier mode by electric power from the secondary battery while the circulating air fan is stopped.

5. The cold insulation container according to claim 4, wherein a part of the thermoelectric generating module is set in the Peltier mode.

\* \* \* \* \*